United States Patent [19]
Ysbrand

[11] Patent Number: 5,373,108
[45] Date of Patent: Dec. 13, 1994

[54] DUAL DUROMETER RIBBON AND METHOD OF MANUFACTURE

[76] Inventor: Floyd Ysbrand, 2500 Davis Blvd., P.O. Box 1786, Joplin, Mo. 64802

[21] Appl. No.: 118,019

[22] Filed: Sep. 8, 1993

[51] Int. Cl.$^5$ .............................................. H05K 1/02
[52] U.S. Cl. ........................... 174/117 F; 174/117 FF; 174/268; 174/259
[58] Field of Search ............ 174/117 F, 117 FF, 268, 174/254; 361/826, 752, 749; 439/67, 77

[56] References Cited

U.S. PATENT DOCUMENTS

| | | | |
|---|---|---|---|
| 4,092,057 | 5/1978 | Walton | 339/17 |
| 4,098,628 | 7/1978 | Walton | 156/52 |
| 4,157,612 | 6/1979 | Rainal | 29/628 |
| 4,658,090 | 4/1987 | Coon | 174/119 |
| 4,904,429 | 2/1990 | Takahashi et al. | 264/46.7 |
| 4,923,537 | 5/1990 | Matsushima | 156/48 |
| 4,991,665 | 2/1991 | Kueneman | 174/34 |
| 5,134,252 | 7/1992 | Himeno et al. | 174/268 |
| 5,158,466 | 10/1992 | Schreiber et al. | 439/67 |

*Primary Examiner*—Leo P. Picard
*Assistant Examiner*—L. Thomas

*Attorney, Agent, or Firm*—Frank P. Presta

[57] ABSTRACT

A dual durometer ribbon generally consisting of a preform and cover, typically formed by an injection molding process. The preform has a low durometer midsection and a plurality of high durometer ends. The high durometer ends are attached to the low durometer midsection at narrow blend areas where the high durometer material blends with the low durometer material. A plurality of printed circuit termination boards rests within recesses located on the top surface of each of the high durometer ends. The recesses are of uniform depth and have an outer border of uniform thickness. The printed circuit termination boards typically have slotted through holes at a receptacle end of the printed circuit board and female connectors are located on one of the surfaces of the printed circuit boards. A plurality of conductors rest within groves contained on the low durometer midsection. The conductors are terminate at the through holes in the printed circuit termination board. The cover is adhesively attached to the top surface of the preform covering the grooves containing the conductors and the recesses containing the printed circuit termination boards.

11 Claims, 6 Drawing Sheets

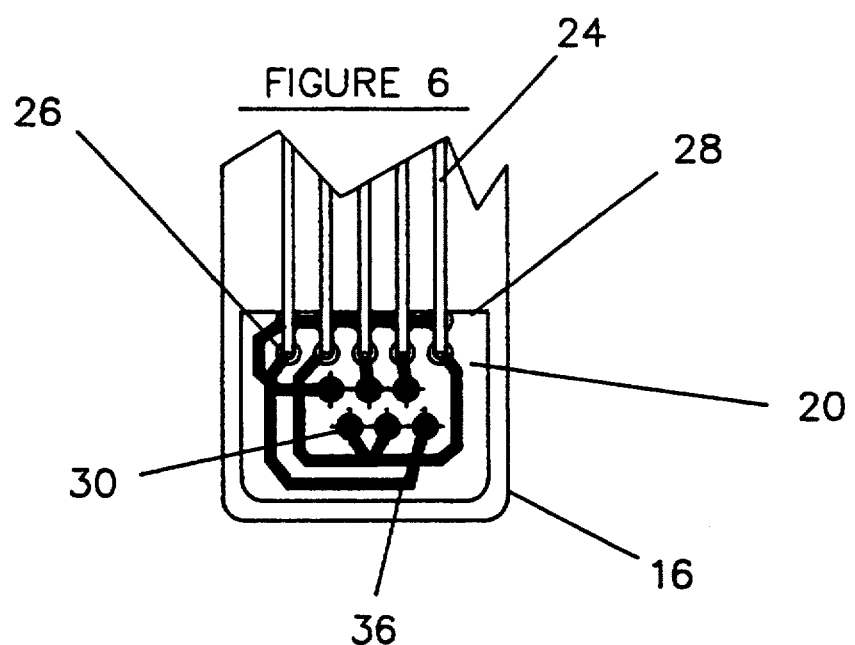

DUAL DUROMETER RIBBON AND METHOD OF MANUFACTURE

BACKGROUND OF THE INVENTION

The present invention relates to a dual durometer ribbon and a method of manufacture and more particularly to a dual durometer ribbon that provides a high degree of flexibility between electrical circuit connections.

There are many types of cables and ribbons used to join electrical apparatuses or components within a particular device. The type of cable used is generally determined from the particular application. There are flexible cables and ribbons of various types and rigid cable for other applications. All the ribbons or cables have some sort of electrical connector on the ends. The connectors can be male or female plugs, printed circuit board with various means of attaching to a particular component, or there can be provisions for soldering.

Between the connectors are conductors that make up the ribbon or cable. The conductors provide for electrical paths between the connectors. The conductors can be wrapped, or weaved in a particular manner or they can be run in a parallel spaced relationship. The conductors in one well known application is molded in a ribbon such as those used in computer applications and have male or female conductors at the ends.

This invention provides a highly flexible ribbon used in lieu of a standard printed wiring cable. The standard printed wiring cable does not have any flexibility or at least very little. The electrical conductors are typically provided on a rigid material and provides electrical connections between two or more printed circuit boards. For the standard printed wiring cable to electrically join separate circuit boards, the circuit boards must be in a fixed and properly spaced relationship. If they are out of position, even slightly, the typical standard printed wiring cable will not be able to make a secure electrical connection or at least not very easily.

Other prior art teaches flexible insulating film that connects two rigid connectors. The insulating film is, in some cases, permanently connected to rigid connectors and in other cases the insulating film is to be connected to the connectors designed to engage an external female socket. These methods tend to be problematic due to lack of overall flexibility and low resistivity to tear. Furthermore, the prior methods are less resistive to abrasion and more difficult to install.

It has also been known to provide flexible wiring circuits made by laminating conductors between insulating films and phenolic resin, and by using a molding compound to form a solid molding around a bundle of wires. Another application uses a ribbon that can be bent in a circular pattern. It is formed by incorporating thin conductors on a thin but semi rigid insulating material.

The known prior art does not provide flexibility in all directions while providing the capability of using multiple size conductors. Nor does the prior art tech the use of a preform body in which conductors and termination devices are added after the preform is made.

Accordingly, it is an object of the present invention to provide a dual durometer ribbon adapted to provide a high degree of flexibility. With the dual durometer ribbon of this invention it has been found that the flexibility easily allows components to be electrically joined, even when positioned improperly.

Another object of the present invention is to provide a dual durometer ribbon constructed to provide a very durable cable that can withstand a high degree of abuse, abrasion and tearing while maintaining the conductors within.

A further object of the present invention is to provide a dual durometer ribbon adapted for use in place of a standard printed wiring cable.

Still another object of the present invention is to provide a method of manufacture for the dual durometer ribbon that will produce a high degree of flexibility for the conductor run yet provide less flexibility at the ends where the connections are made. The method of manufacture of this invention is preferably by an injecting molding process in which there is a high durometer material used at the ends for less flexibility for a low durometer material for the cable run to provide a high degree of flexibility. The high durometer and low durometer material must be blended where they met to have a continuous unit.

Still a further object of the present invention is to provide a dual durometer ribbon and method of manufacture that is relatively inexpensive to market yet still provide the desired characteristics.

Another object of the present invention is to provide a dual durometer ribbon and a method of manufacture that allow use of various sizes of conductors within a single ribbon.

These and other objects and features of the present invention will be better understood and appreciated from the following detailed description of the main embodiment thereof, selected for purposes of illustration and shown in the accompanying drawings.

SUMMARY OF THE INVENTION

To accomplish the foregoing and other objects of this invention there is provided a dual durometer ribbon and a method of manufacture and more particularly to a dual durometer ribbon preformed from a high and low durometer polyurethane to incorporate a plurality of conductors and standard printed circuit termination boards.

The dual durometer ribbon and the method of manufacture of this invention include a dual durometer ribbon that is preformed from a high and low durometer material to be used in lieu of standard printed wiring cables. The dual durometer ribbon preform incorporates printed circuit termination boards at both ends and wire runs between the printed circuit termination boards. The wires are soldered onto the slotted through holes at the receptacle ends of the printed circuit termination boards. Once the terminations have been completed the printed termination boards and wires are covered.

The preform, in the preferred embodiment, is constructed by injection molding. The ends in which the printed circuit board terminations are installed are molded from a high durometer polyurethane. The wiring run or low durometer midsection between the ends is molded from a low durometer polyurethane. There is an area in which the high and low durometer polyurethanes meet and blend. These must blend together to form a complete integrated preform.

Once the molding compounds are in the mold, it is cured for a predetermined time period and temperature. The rigid printed circuit termination boards are then placed in the preform. The conductors are cut too approximately the length of the low durometer midsection of the preform. The conductors are then placed in the appropriate grooves and soldered to the through holes located on the receptacle end of the printed circuit termination boards. The cover is then bound to the preform by a thermal adhesive.

BRIEF DESCRIPTION OF THE DRAWINGS

FIG. 6 shows a top view of another high durometer end with printed circuit termination board installed with conductors attached.

DETAILED DESCRIPTION

Figure 1:
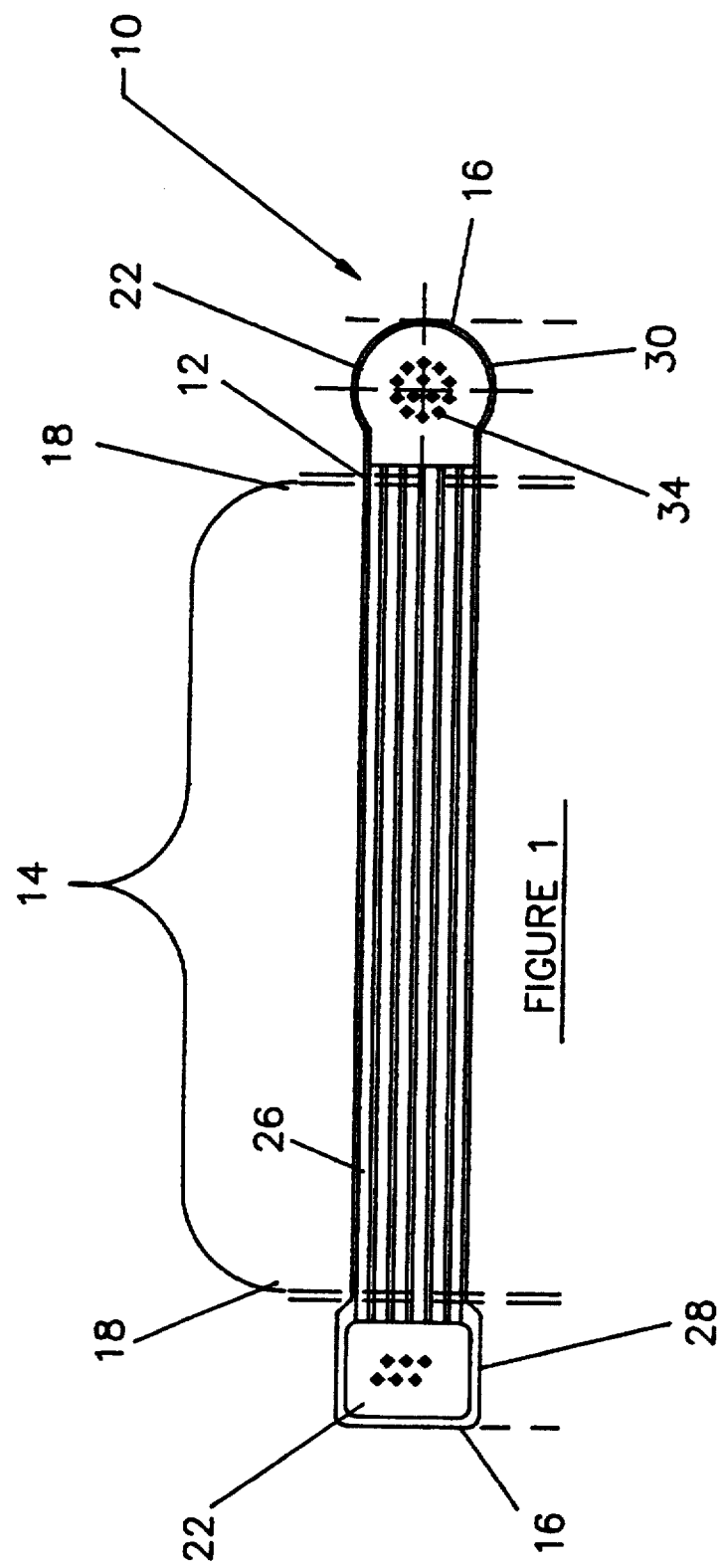
FIG. 1 shows a top view of a preferred embodiment of the dual durometer preform.

Referring now to the drawings in general there is shown one preferred embodiment for the dual durometer ribbon 10 and method of manufacture of this invention.

Figure 3:
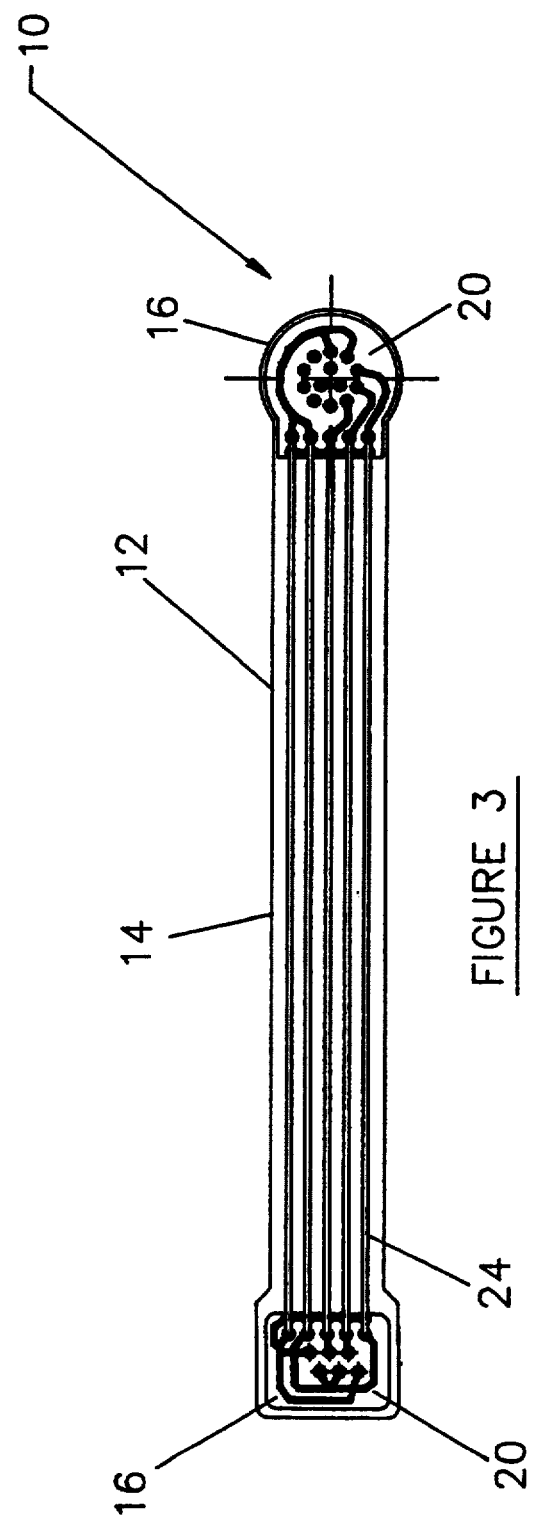
FIG. 3 shows a top view of preform with conductors installed.

Referring to FIGS. 1 and 3, there is shown the preferred embodiment of the dual durometer ribbon 10 of this invention. Generally, the dual durometer ribbon 10 of this invention consists of a polyurethane preform 12. The preform 12, as illustrated, has an elongated or rectangular low durometer polyurethane midsection 14. High durometer polyurethane ends 16 are connected to the low durometer midsection 14 through a narrow blend area 18. Printed circuit termination boards 20 are contained within recesses 22 on the high durometer polyurethane ends 16. Conductors 24 run within grooves 26 in the low durometer polyurethane midsection 14 from high durometer polyurethane end 28 to high durometer polyurethane end 30. A preform cover 32 closes the structure to complete the dual durometer ribbon 10 of this invention.

The dual durometer ribbon 10 of this invention provides a highly flexible low durometer midsection 14. This provides for the ease of installation, formability and long term flexibility for a dynamic cable application. The dual durometer is intended for use to electrically connect electrical apparatuses or components in lieu of standard printed wiring cables. The standard printed wiring cables are generally semi-rigid and do not allow flexibility for installation or during operation.

The preferred embodiment and the best mode contemplated of the dual durometer ribbon and the method of manufacture of the present invention are herein described. However, it should be understood that the best mode for carrying out the invention hereinafter described is offered by way of illustration and not by the way of limitation. It is intended that the scope of the invention includes all modifications that incorporate its principle design features.

The preform 12 generally is constructed having a low durometer midsection 14 with a top and bottom surface. A plurality of high durometer ends 16 having a top and bottom surface are attached to the low durometer midsection 14 at specific locations 18 depending on the application. In the embodiment as shown, there is a pair of ends 16, one being at each end of the rectangular low durometer midsection 14. In other applications, the high durometer ends 16 could be angled from the end of the midsection 14 or there could be multiple ends 16 coming off the sides of the midsection 14. The specific application would determine the location and number of high durometer ends 16 needed.

The location where the high durometer ends 16 are joined with the low durometer midsection 14 creates areas where high durometer material blends with low durometer material. It is desirable to maintain a narrow blend area. This is referred to as a narrow blend area referenced as reference numeral 18 on the drawings.

The top surface of the low durometer midsection 14 contains a plurality of parallel spaced groves 26 extending the length thereof, ending at the recesses of the high durometer ends 16. Each groove 26 are sized to receive a conductor 24. The top surface of each of the high durometer ends 16 have a recess area 22 of uniform depth and border thickness. The recesses 22 receive printed circuit termination boards 20 or similar or equivalent connection devices.

The printed circuit termination boards 20 rest within the recesses 22 located on the top surface of the high durometer ends 16. The printed circuit termination boards 20 comprise a printed circuit board having slotted through holes 26 at a receptacle end 28 of the printed circuit termination board 20. A plurality of connectors 30 are located on the surface of the printed circuit boards 20. The connectors 30 are typically female connectors that receive pins or a male connector located on some electrical device or circuit board. The slotted through holes 26 and the connectors 30 are joined by electrically conductive paths 36 located on the surface of the printed circuit termination boards 20. The conductive paths 36 electrically links the connectors 30 to the conductors 24 attached to the slotted through holes 26 located on the receptacle end 28. The connectors 24 are typically soldered to the slotted through holes 26.

The high durometer ends 16 of the preform 12 could also have a plurality of openings 34 for exposing the female connectors 30 on the printed circuit termination boards 20. The high durometer ends 16 of the cover 32 may also have a plurality of openings 38 to expose the connectors 30. In the embodiment as shown there are a plurality of openings 34 and 38. In other embodiments there could be a single opening or openings of specific shapes for exposing specific types of connectors 30.

A plurality of conductors 24 are placed within the groves 26 contained on the low durometer midsection 14. The conductors 24 are attached to and terminate at the through holes 26 in the printed circuit termination boards 20. Typically, the ends of the conductors 24 are soldered to the through holes 26. The conductors 24 are not necessarily of the same gauge. There can be multiple sizes of conductors 24 depending on the particular load expected across the conductor 24. This feature provides for flexibility in application that is not available in all of the prior known cables or ribbons of this nature.

Figure 2:
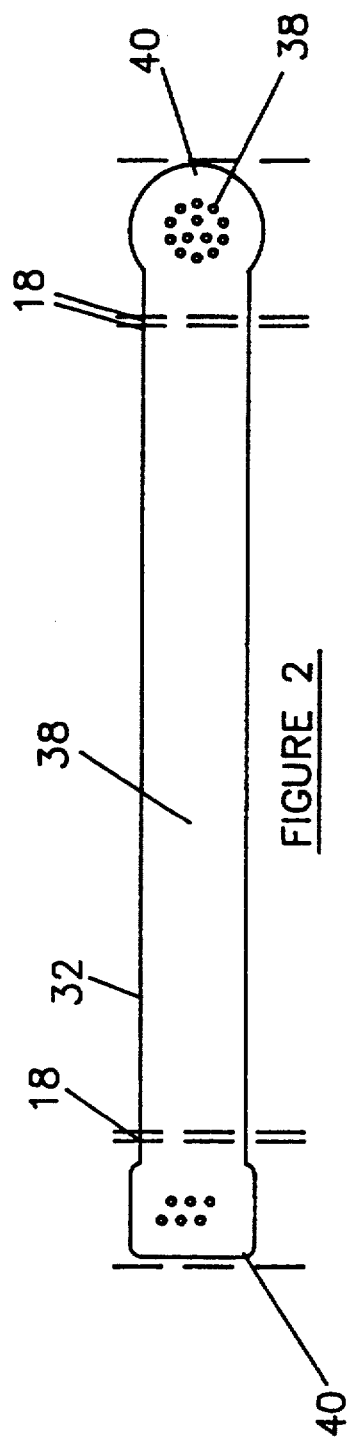
FIG. 2 shows a top view of the dual durometer cover.
Figure 4:
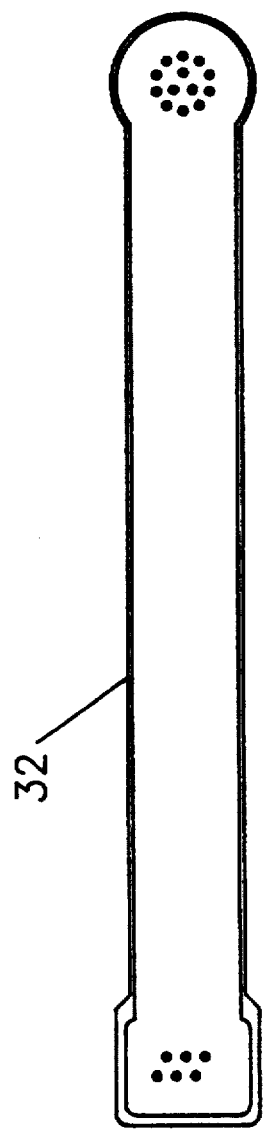
FIG. 4 shows the assembled dual durometer ribbon with the cover installed.
Figure 5:
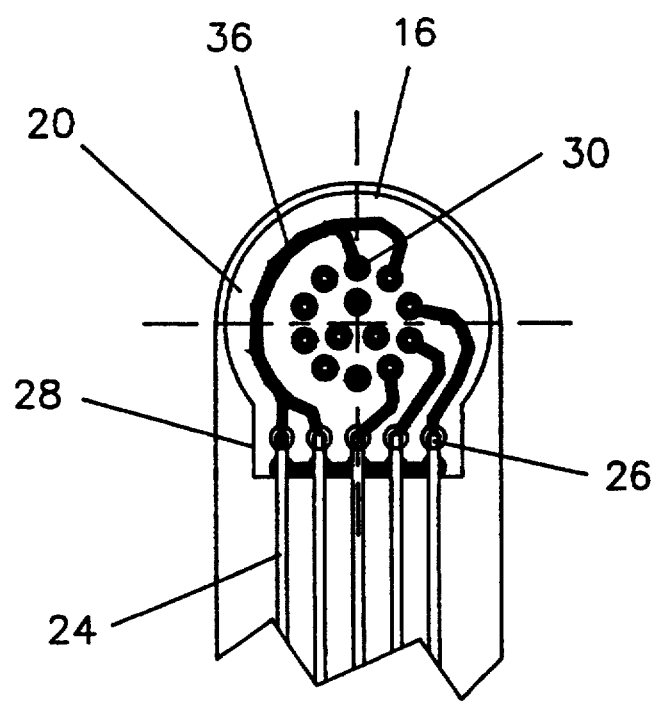
FIG. 5 shows a top view of a high durometer end with printed circuit termination board installed with conductors attached.

There is also a cover 32 having a low durometer midsection 38 and a plurality of high durometer ends 40. The bottom surface of the cover 32 generally corresponding to the shape of the top surface of the preform 12. The cover 32 is typically adhesively attached to the top surface of the preform 12 covering the groves 26 containing the conductors 24 and the recesses 22 containing the printed circuit termination boards 20. The cover 32, as shown in FIGS. 2 and 4 has a rectangular low durometer midsection 38 and high durometer ends 40 very similar to the preform 12 described above.

The method of manufacture the dual durometer ribbon 10, in the preferred embodiment, is by an injection molding or cast molding process. In the preferred embodiment, the preform 12 and the cover 32 are cast from high and low durometer polyurethane. Other methods and other materials may be used without departing from the scope and spirit of the inventive concepts herein described.

In one embodiment, a preform close out mold and a cover mold are constructed using a computer controlled laser etching device. Once complete, the center of the preform close out mold is filled with low durometer polyurethane. The ends sections are immediately thereafter filed with a high durometer polyurethane. The low durometer material blends with the high durometer material in a narrow blend area 18 to join the high durometer ends 16 to the low durometer midsection 14.

The molds are constructed to provide the recesses 22 in the high durometer ends 16 with a uniform depth and uniform border thickness to form a holder area for receiving the printed circuit termination boards 20. The geometrical shape of the high durometer ends 16, as illustrated, are semi-circular and rectangular. They could be in any shape depending on the particular application. The molds also provide for the parallel grooves 26 constructed on the top surface of the low durometer midsection 14 for receiving conductors 24.

Once the molds are filled with the high durometer and low durometer polyurethane, they are closed out and cured at 180 degrees Fahrenheit for at least two hours. After curing the preform 12 and cover 32 are removed from the molds. The curing time and temperature will of course vary depending on the particular material being used.

The conductors 24 are cut to length, trimmed with a braid strip, and tinned. The tinned ends of the conductors 24 are soldered to the slotted through holes 26 located on the receptacle end 28 on the printed circuit termination boards 20, thereby forming a solder assembly. Once the ends of the conductors 24 are soldered to the slotted through holes 26, the connectors 30 of the opposing printed circuit termination boards 20 are electrically linked in a predetermined order based upon the conductive paths 36. The solder assembly is cleaned. The solder assembly and preform 12 can be cleaned in a freon spray tank.

The solder assembly consisting of the conductors 24 and printed circuit termination boards 20 can than be installed in the recesses 22 and groves 26. The volume of low durometer material located between the grooves 26 acts as insulation thereby insulating the conductors 24 from one another.

The cover 32 is constructed in a similar manner as the preform 12. Typically, the cover 32 will have a low durometer midsection 38 and high durometer ends 40 in the general shape corresponding to the shape of the preform 12. The cover 32 is attached to the preform 12 to complete the dual durometer ribbon 10 of this invention.

A thermal adhesive is applied to the inside surfaces of the preform 12 before installing the solder assembly. The preform 12, with the conductors 24 and printed circuit termination boards 20 installed, is placed in a close out mold. A thin layer of thermal adhesive is applied onto the top surface of the preform 12 and solder assembly. The cover 32 is installed over the preform 12 and solder assembly. The mold is closed out and cured at 180 degrees Fahrenheit for three hours. After curing the completed dual durometer ribbon 10 is removed from the mold and cleaned.

Having described the invention in detail, those skilled in the art will appreciate that modifications may be made of the invention without departing from the spirit of the inventive concept herein described.

Therefore, it is not intended that the scope of the invention be limited to the specific and preferred embodiments illustrated and described. Rather, it is intended that the scope of the invention be determined by the appended claims and their equivalents.

What is claimed is:

1. A dual durometer ribbon comprising:
a preform comprising a low durometer midsection, with a top and bottom surface, and a plurality of high durometer ends, having a top and bottom surface, attached to said low durometer midsection at fixed points, said fixed points being blend areas where high durometer material of said high durometer ends blends with low durometer material of said low durometer midsection to join said high durometer material with said low durometer material;
a plurality of printed circuit termination boards resting in recesses located on said top surface of said high durometer ends, said recesses being of uniform depth and having an outer border thickness, said printed circuit termination boards comprising a printed circuit board having slotted through holes at a receptacle end of said printed circuit board and connectors located on the surface of said printed termination circuit boards;
a plurality of conductors resting in groves contained on said low durometer midsection, said groves being in a parallel spaced relationship ending at said recesses of said high durometer ends, said conductors attached to and terminating at said through holes in said printed circuit termination boards; and
a cover having a low durometer midsection and a plurality of high durometer ends, a bottom surface of said cover corresponding to the shape of said top surface of said preform, said cover attached to said top surface of said preform covering said grooves containing said conductors and said recesses containing said printed circuit termination boards.

2. The dual durometer ribbon as set forth in claim 1 in which said preform contains two high durometer ends attached to said low durometer midsection.

3. A dual durometer ribbon as set forth in claim 1 in which said preform and said cover are cast from high and low durometer polyurethane.

4. A dual durometer ribbon as set forth in claim 1 in which said slotted through holes and said connectors are joined by a plurality of electrically conductive paths located on the surface of said printed circuit termination board electrically linking said connectors to said conductors located on said low durometer midsection.

5. The dual durometer ribbon as set forth in claim 1 in which said high durometer ends of said preform further comprises a plurality of openings exposing said connectors of said printed circuit termination boards.

6. The dual durometer ribbon as set forth in claim 1 in which said high durometer ends of said cover further comprises a plurality of openings exposing said connectors of said printed circuit termination boards.

7. A dual durometer ribbon comprising:

a preform having a rectangular low durometer midsection and a plurality of high durometer ends, each of said high durometer ends joined to said low durometer midsection at a blend area where low durometer material blends with high durometer material, a top surface of said low durometer midsection having a plurality of parallel spaced groves extending the length thereof, and a top surface of each of said high durometer ends having a recess area of uniform depth and border thickness;

printed circuit termination boards resting within each of said recesses on said high durometer ends, said printed circuit termination boards each having a plurality of slotted through holes at a receptacle end and connectors located on said printed circuit termination board; and a plurality of spaced conductors contained within said parallel spaced grooves running the length of said low durometer midsection and terminating at said slotted through holes on said printed circuit termination boards.

8. A dual durometer ribbon as set forth in claim 7 further comprising a cover having a rectangular low durometer midsection and high durometer ends, said cover having a general shape corresponding to the shape of said preform, said cover attached to a top surface of said preform covering said conductors in said groves and printed circuit termination boards in said recesses in said high durometer ends.

9. The dual durometer ribbon as set forth in claim 7 in which said printed circuit termination boards contain conductive metallic paths on a surface of said printed circuit termination boards to electrically link said conductors which are terminated at said through holes in said printed circuit termination board, to said connectors located on said printed circuit termination boards.

10. The dual durometer ribbon as set forth in claim 7 in which a bottom surface of said high durometer ends of said preform contains a plurality of openings to expose said connectors on said printed circuit termination boards in said recesses.

11. The dual durometer ribbon as set forth in claim 8 in which said high durometer ends of said cover contains a plurality of openings to expose said connectors on said printed circuit termination boards contain within said recesses of said high durometer ends.

* * * * *